(12) United States Patent
Okuda et al.

(10) Patent No.: US 6,480,311 B1
(45) Date of Patent: Nov. 12, 2002

(54) PEAK-HOLD CIRCUIT AND AN INFRARED COMMUNICATION DEVICE PROVIDED WITH SUCH A CIRCUIT

(75) Inventors: Takanori Okuda, Kashiba; Naruichi Yokogawa, Kashihara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/132,898

(22) Filed: Aug. 12, 1998

(30) Foreign Application Priority Data

Sep. 18, 1997 (JP) ............................................. 9-253811

(51) Int. Cl.[7] .......................... H04B 10/24; H04B 10/06
(52) U.S. Cl. ...................... 359/152; 359/189; 327/122
(58) Field of Search ......................... 359/167, 152–154, 359/189; 370/509; 327/122

(56) References Cited

U.S. PATENT DOCUMENTS

| | | | | |
|---|---|---|---|---|
| 4,400,633 A | * | 8/1983 | Mouri | 307/351 |
| 4,741,010 A | * | 4/1988 | Hino et al. | 378/105 |
| 5,025,176 A | | 6/1991 | Takeno | 307/351 |
| 5,069,214 A | * | 12/1991 | Samaras et al. | 128/633 |
| 5,448,154 A | * | 9/1995 | Kanke et al. | 322/28 |
| 5,471,169 A | * | 11/1995 | Dendinger | 327/563 |
| 5,589,778 A | * | 12/1996 | Ono et al. | 324/654 |
| 5,762,159 A | * | 6/1998 | Matsuoka et al. | 180/422 |
| 5,892,609 A | * | 4/1999 | Saruwatari | 359/189 |
| 5,930,268 A | * | 7/1999 | Kurby et al. | 370/509 |
| 5,956,169 A | * | 9/1999 | Shimizu | 359/167 |
| 5,978,664 A | * | 11/1999 | Janssen | 455/226.2 |
| 5,995,166 A | * | 11/1999 | Kawano | 348/691 |

FOREIGN PATENT DOCUMENTS

| | | |
|---|---|---|
| EP | 0463586 A | 1/1992 |
| EP | 0580089 A | 1/1994 |
| EP | 0597632 A | 5/1994 |
| EP | 0681378 A | 11/1995 |
| JP | 63233377 A | 9/1988 |
| JP | 03295472 A | 12/1991 |

OTHER PUBLICATIONS

Transister Technology –Special–No. 17 (pp. 86–90 published on Sep. 1, 1989).
"DC–1GB/S Burst–Mode Compatible Receiver for Optical Bus Applications", Yusuke Ota et al., *Journal of Lightwave Technology, US, IEEE*, vol. 10, No. 2, pp. 244–249, Feb. 1, 1992.

* cited by examiner

*Primary Examiner*—Leslie Pascal

(57) ABSTRACT

In a peak-hold circuit, a hold capacitor captures the peak value of an input signal and a reset section carries out a resetting operation on the holding value of the hold capacitor when, upon switching inputs, it receives a reset signal. The reset section, upon receipt of the reset signal, improves the response speed of a peak-hold section by a predetermined time period. The reset section is provided with a constant current circuit and a switching circuit for respectively increasing a charging current and a discharging current of the peak-hold section.

10 Claims, 15 Drawing Sheets

FIG.13(e) PRIOR ART L1

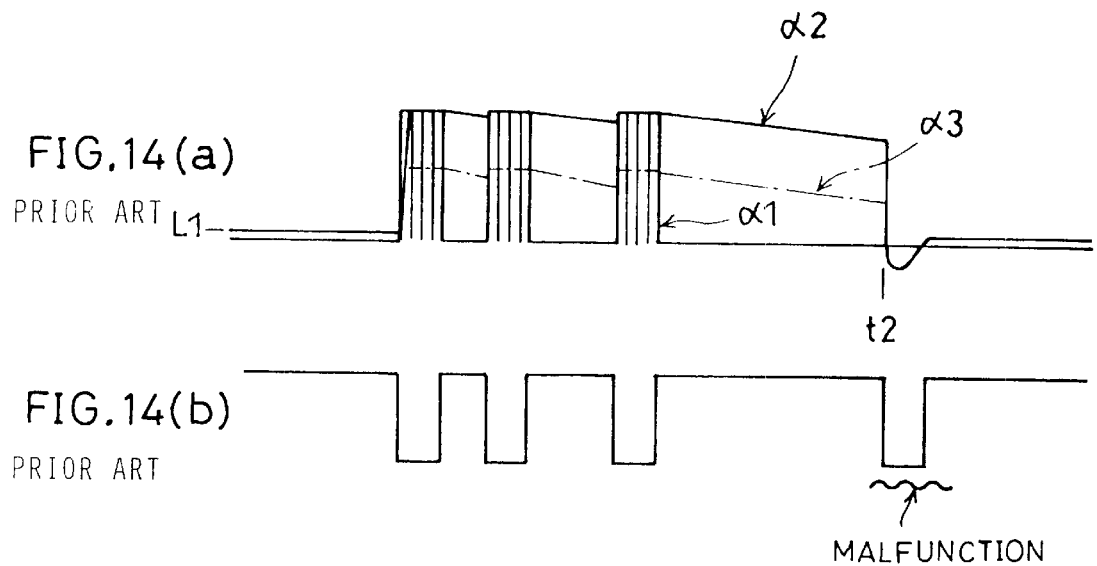
FIG.14(a) PRIOR ART
FIG.14(b) PRIOR ART
MALFUNCTION
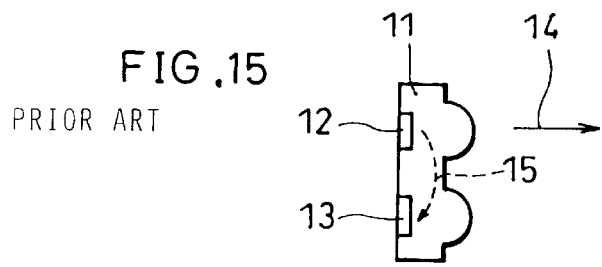
FIG.15 PRIOR ART

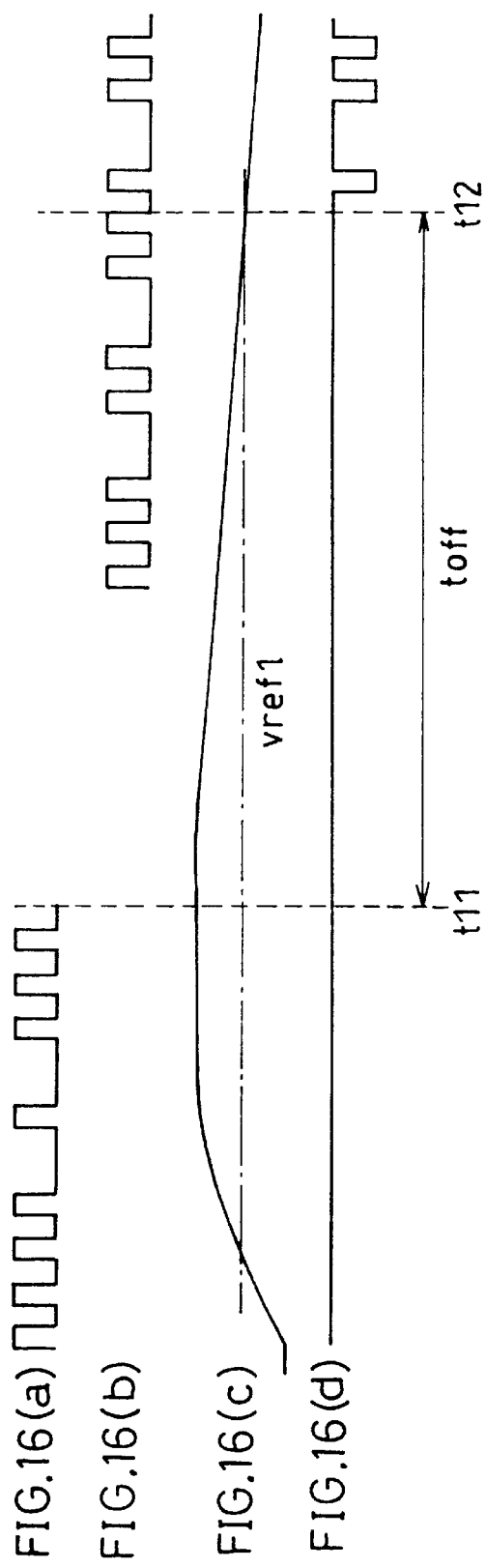

PEAK-HOLD CIRCUIT AND AN INFRARED COMMUNICATION DEVICE PROVIDED WITH SUCH A CIRCUIT

FIELD OF THE INVENTION

The present invention relates to a peak-hold circuit and an infrared communication device provided with such a circuit. It further relates to the prevention of malfunction resulting from variations in the input-signal level.

BACKGROUND OF THE INVENTION

FIG. 8 is a block diagram showing an electrical construction of a commonly-used infrared receiver 1. Infrared light from a transmitting device is photoelectrically transferred by a photodiode d, and inputted to amplifier a2 capable of variably gaining an ac component through pre-amplifier a1 and coupling capacitor c0. The output of amplifier a2 is voltage-divided by resistors r1 and r2, and then inputted to peak-hold circuit ph1. Peak-hold circuit ph1, which has a comparatively short time constant, holds the peak value of the input signal by using hold capacitor c1.

The holding value of peak-hold circuit ph1 is voltage-divided by dividing resistors r3 and r4, and inputted to the inversion input terminal of comparator cmp1. The output of amplifier a2 is applied to the non-inversion input terminal of comparator cmp1 through dividing resistors r1 and r2. The output of comparator cmp1 is applied to the base of output transistor q1. The collector of output transistor q1 is connected to a power line with "high level" Vcc through resistor r5, and is also connected to an output terminal p0, while the emitter thereof is grounded.

Moreover, the output of amplifier a2 is inputted to peak-hold circuit ph2 having a comparatively long time constant, and the holding value of hold capacitor c2 is inputted to the non-inversion input terminal of comparator cmp2. A predetermined reference voltage vref1 is applied to the inversion input terminal of the above-mentioned comparator cmp2 so that comparator cmp2 outputs an AGC signal. This increases the gain of amplifier a2 when the holding value of peak-hold circuit ph2 is lower than the reference voltage vref1 and decreases it when the holding value thereof is higher than the reference voltage vref1. Therefore, the peak level of noise of externally-applied light is captured by peak-hold circuit ph2. When the level becomes greater than the reference voltage vref1, an AGC operation for reducing the gain of amplifier a2 is carried out.

In the infrared receiver 1 having the above-mentioned construction, the photoelectrically-transferred output of the photodiode d, as shown in FIG. 9(a), is amplified by amplifiers a1 and a2 as is indicated by reference symbol $\alpha 1$ in FIG. 9(b). The holding value of peak-hold circuit ph1 is indicated by reference symbol $\alpha 2$ while the discrimination level of comparator cmp1, which is determined by divided-voltage outputs of resistors r3 and r4, is indicated by reference symbol $\alpha 3$. Therefore, comparator cmp1 level-discriminates the output of amplifier a2 by using the divided voltage values of the holding value of peak-hold circuit ph1. The results of the discrimination is inverted by output transistor q1 and resistor r5. Thus, a low-active receiving signal waveform, as shown in FIG. 9(c), is outputted to the output terminal p0.

In another situation, multiples of infrared communication devices, each of which uses the infrared receiver 1 having the above-mentioned construction, are connected in a time-sharing manner. That is, a common host device 2 and multiples of subordinate devices 3 communicate with each other, for example, as shown in FIG. 10. Supposing that the host device 2 is a receiver and one of the subordinate devices 3 is a transmitter, the light-receiving level of the host device 2 varies greatly depending on the distance and directional angle between the respective subordinate devices 3 and the host device 2.

Therefore, in the case when infrared light from a subordinate device located in a comparatively short range or on the front side of the photodiode d is switched to infrared light, from another subordinate device located in a comparatively long range or on the non-front side of the photodiode d, in response to the level variation of the receiving signal as indicated by reference symbol $\alpha 1$, the peak hold level merely follows in a manner as indicated by reference symbol $\alpha 2$, as shown in FIG. 11(a). As such, the detection level is merely allowed to follow in a manner as indicated by reference symbol $\alpha 3$. In other words, upon receiving a signal from a subordinate device whose signal level is small and which is located in a long range or on the non-front side, the detection level, which still remains great after having followed the signal level of the subordinate device located in a short range or on the front side, fails to return to a predetermined initial level L1. This results in a problem in which a discrimination error occurs in comparator cmp1, thereby causing a malfunction in the output waveform as shown in FIG. 11(b).

FIG. 12 is a block diagram which shows an electrical construction of typical prior-art peak-hold circuit ph11 which can solve the above-mentioned problem. An input signal, which has been inputted to the input terminal p1, is inputted to the non-inversion input terminal of comparator cmp11 through input resistor r11. To the inversion input terminal of this comparator cmp11 is inputted the output from the output terminal p2 of comparator cmp12 which will be described later, through feed-back resistor r12. Comparator cmp11 supplies hold capacitor c11 with a charging current through resistor r13 and diode d11 when the input signal is higher than the output signal. Discharging constant current source f11, which has a current value smaller than the charging current from comparator cmp11, is parallel-connected to hold capacitor c11. The terminal voltage of hold capacitor c11 is outputted to the output terminal p2 through the above-mentioned comparator cmp12 that functions as a buffer.

The output of the above-mentioned comparator cmp11 is also supplied to the inversion input terminal of comparator cmp13 through resistor r14, and the non-inversion input terminal of comparator cmp13 is grounded through resistor r15. Comparator cmp13 outputs "low level" to capacitor c12 from its output terminal when the output of comparator cmp11 goes high. Further, the input terminal of capacitor c12 is pulled up to "high level" Vs through resistor r16. Therefore, when comparator cmp13 outputs "low level", capacitor c12 makes a discharge instantaneously, and when the output of comparator cmp13 is opened, charging is carried out in accordance with the time constant of c12·r16.

The terminal voltage of capacitor c12 is inputted to the non-inversion input terminal of comparator cmp14, and if the terminal voltage of capacitor c12 is higher than the reference voltage vref11 inputted to the inversion input terminal, comparator cmp14 outputs "high level". If the terminal voltage is not higher, it outputs a "low level". The output from the above-mentioned comparator cmp14 is voltage-divided by resistors r17 and r18, and supplied to the base of transistor q11. The collector of transistor q11 is connected to the input terminal of the aforementioned hold capacitor c11 through resistor r19, and the emitter is grounded.

Therefore, during the period in which the output from comparator cmp14 is maintained at a "high level", transistor q11 is parallel-connected to constant current source f11 so as to allow hold capacitor c11 to discharge, and maintained at the aforementioned initial level L1.

In the peak-hold circuit ph11 having the above-mentioned construction, in response to the input signal waveform as shown in FIG. 13(a), the output signal waveform of comparator cmp11 has a shape as indicated in FIG. 13(b), and the output signal waveform of comparator cmp13 has a shape as indicated in FIG. 13(c). Therefore, in comparator cmp14, by adjusting the time constant c12□r16 as well as the reference voltage vref11, judgement timing for making a judgement that the input signal is no longer detected is delayed so that transistor q11 is allowed to conduct so as to carry out a resetting operation at time t2 at which a predetermined time period td has elapsed from time t1 when the input signal was no longer detected, as shown in FIG. 13(d). Thus, the holding value of hold capacitor c11, shown in FIG. 13(e), can be reset to the aforementioned initial level L1.

In peak-hold circuit ph11 having the above-mentioned construction, upon the resetting operation, since transistor q11 is allowed to conduct, making the charge of hold capacitor c11 discharged instantaneously, the holding value drops lower than the aforementioned initial level L1 as indicated by reference symbol α2 in FIG. 14(a). Here, in FIG. 14(a), the input signal is indicated by reference symbol α1 and the detection level is indicated by reference symbol α3 in the same manner as FIG. 9(b) and FIG. 11(a). Consequently, the output whose waveform is shaped by an output circuit consisting of comparator cmp1, transistor q1, etc. comes to have a shape as shown in FIG. 14(b), resulting in a problem in which error pulses are generated as shown in FIG. 14(b).

Moreover, infrared communication elements have been designed so as to be installed in portable information communication devices, and elements capable of bidirectional communication, which are integrally constituted by light receiving and emitting elements so as to allow miniaturization and cost reduction, have been developed. FIG. 15 shows a schematic construction of a bidirectional communication element 11. In this bidirectional communication element 11, a light-emitting diode that forms the transmitting end, substrate 12 on which an integrated circuit for driving the diode is installed, a diode that forms the receiving end, and a substrate 13 on which a receiving integrated circuit is installed are sealed by resin, etc. as an integral part.

In this construction, one portion of output light directed to the communication element on the other communication end, indicated by reference symbol 14, is turned around to the light-receiving element side as indicated by reference symbol 15 through the sealing resin, etc. This results in the holding value of the aforementioned peak-hold circuit ph2 rising, and the gain in amplifier a2 dropping due to the aforementioned AGC operation.

In other words, as illustrated in FIG. 16(a), even if the output of a transmitting signal is stopped and switched to the receiving operation at time t11, the holding value of peak-hold circuit ph2 still remains high as shown in FIG. 16(c), and comes to be effective in the receiving operation from time t12 at which it drops below the aforementioned reference voltage vref1. This thereby makes it possible to start a waveform-shaping operation on the received signal as shown in FIG. 16(d) in response to the transmitting signal from the other communication end as shown in FIG. 16(b). For this reason, the period between time t11 and time t12 forms dead time during which no signal is received, resulting in degradation in performance in the communication device.

Supposing that the electrostatic capacity of hold capacitor c2 is c2, a voltage rise in hold capacitor c2 due to a signal input is Δvc2, and the discharging current is ic, dead time toff is represented as follows:

$$toFF = c2 \times \Delta vc2 / ic \qquad (1).$$

SUMMARY OF THE INVENTION

The objective of the present invention is to provide a peak-hold circuit which can prevent malfunction and which has improved performances and an infrared communication device using such a peak-hold circuit.

In order to solve the above-mentioned objective, the peak-hold circuit of the present invention, which is a peak-hold circuit in which a hold means captures the peak value of an input signal and a reset means carries out a resetting operation on the holding value of the hold means when, upon switching inputs, it receives a reset signal, is designed so that the reset means, upon receipt of the reset signal, improves the response speed of the hold means by a predetermined time period.

In the above-mentioned arrangement, the charge of the hold capacitor is not discharged instantaneously by using a switching means and a resistor etc., but is discharged while improving the response speed by minimizing the time constant of the hold means.

Therefore, it becomes possible to prevent undershoot in which the holding value drops below a predetermined initial level, and consequently to prevent malfunction.

In the above-mentioned construction, the reset means is preferably designed to have constant current circuits and switching means for increasing a charging current and a discharging current of the hold means respectively. Thus, the response speed of the hold means can be improved more positively.

In order to achieve the above-mentioned objective, the infrared communication device of the present invention, which is an infrared communication device capable of time-sharing multi-channel communication that has a photoelectric transfer element for photoelectrically transferring a received infrared signal, a peak-hold circuit for capturing a peak value of an output from the photoelectric transfer element and for setting a detection level based upon the peak value and an output circuit for waveform-shaping an output from the photoelectric transfer element by level-discriminating the output based on the detection level, is provided with the peak-hold circuit of the present invention.

In the above-mentioned construction, the resetting operation of the holding value of the peak hold circuit can be carried out without undershoot. Therefore, it is possible to prevent error pulses from appearing in the output waveform detected based upon the holding value, and also to preferably receive infrared signals from a plurality of communication devices having different ranges and angles of beam spread in a time-sharing manner, upon carrying out multi-channel communication.

In order to solve the aforementioned objective, another infrared communication device of the present invention, which is a bidirectional infrared communication device having light receiving and emitting elements that are integral with each other, is provided with a time counter. The time counter, based on the fact that no level variation takes place in a transmitted signal during a predetermined period, detects completion of the transmitted signal, and allows the receiving device to restore its sensitivity.

In the above-mentioned construction, by setting the predetermined period at the maximum dead time that is determined by the communication regulation, completion of transmission can be detected, and in response to this, the holding value of the peak-hold circuit and the sensitivity of the receiving device, which have varied from the predetermined initial level due to infrared light upon transmission, can be reset, and after the lapse of the predetermined period, the receiving operation can be readily started, thereby making it possible to improve the performance.

In the above-mentioned construction, the receiving device is preferably provided with: a gain-variable amplifier for amplifying the photoelectrically transferred output from the light-receiving element; a first peak-hold circuit for carrying out a peak detection using a comparatively short time constant so as to set the detection level based upon the output of the amplifier; a second peak-hold circuit for carrying out a peak detection using a comparatively long time constant so as to achieve the AGC operation by detecting the noise level of the output of the amplifier and controlling the gain of the amplifier in response to the result of the detection; and an output circuit for waveform-shaping by level-discriminating the output of the amplifier by the detection level that has been set by the first peak-hold circuit, in which the time counter carries out a resetting operation on the gain of the amplifier by resetting at least the holding value of the second peak-hold circuit, thereby allowing the sensitivity restoration.

In the above-mentioned construction, by resetting the holding value of the second peak-hold circuit for setting the AGC level, the gain of the amplifier, which amplifies the photoelectrically transferred output from the light-receiving element, is reset so that the sensitivity of the receiving device is restored to the predetermined initial level. In addition, the holding value of the first peak-hold circuit for setting the detection level may also be reset.

For a fuller understanding of the nature and advantages of the invention, reference should be made to the ensuing detailed description taken in conjunction with the accompanying drawings.

BRIEF DESCRIPTION OF THE DRAWINGS

FIGS. 13(a), 13(b), 13(c), 13(d) and 13(e) are waveform diagrams that explain operations of the peak-hold circuit shown in FIG. 12.

FIGS. 14(a) and 14(b) are waveform diagrams that explain problems with the peak-hold circuit shown in FIG. 12 when it is used in the infrared communication device shown in FIG. 8.

FIG. 15 is a cross-sectional view that schematically shows a construction of a small-size, low-cost bidirectional infrared communication element.

FIGS. 16(a), 16(b), 16(c) and 16(d) are waveform diagrams that explain problems with the infrared communication element shown in FIG. 15 when it is used in the infrared receiving device as shown in FIG. 8.

DESCRIPTION OF THE EMBODIMENTS

Referring to FIGS. 1 through 5, the following description will discuss one embodiment of the present invention.

Figure 1:
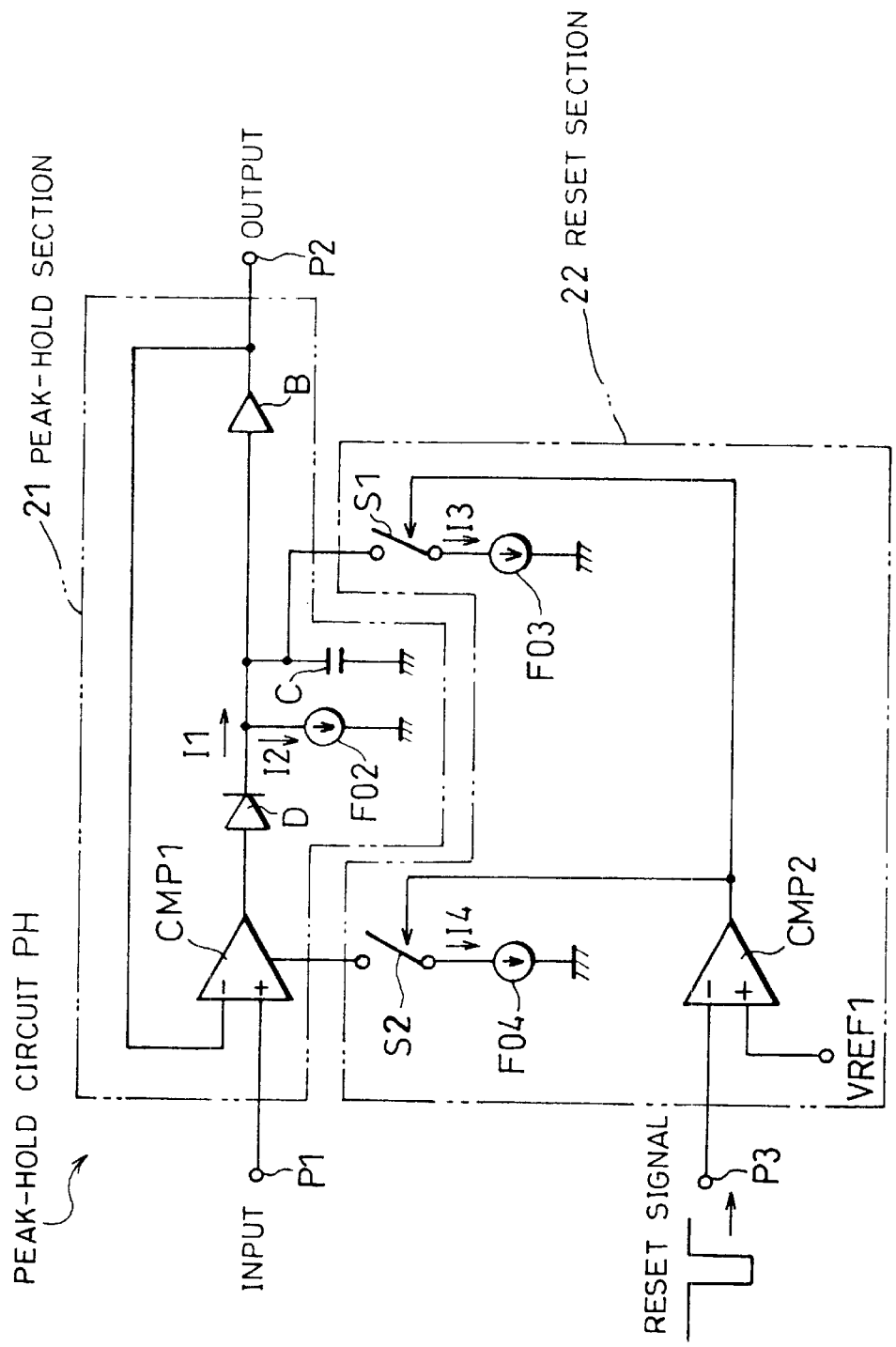
FIG. 1 is a block diagram showing a schematic construction of a peak-hold circuit of one embodiment of the present invention.

FIG. 1 is a block diagram showing a schematic construction of a peak-hold circuit PH of one embodiment of the present invention. This peak-hold circuit PH is mainly constituted by a peak-hold section 21 and a reset section 22. An input signal, supplied through the input terminal P1, is inputted to the peak-hold section 21, and supplied to the non-inversion input terminal of comparator CMP1, and the output signal level of the output terminal P2 is fed back to the inversion input terminal of comparator CMP1. When the input signal level is higher than the output signal level, comparator CMP1 supplies a charging current I1 to a hold capacitor C through a rectifying element D. The hold capacitor C, parallel-connected to constant current source F02, is always discharged with a constant current I2. Here, I1>I2 holds; therefore, the hold capacitor C maintains the peak level of the input signal, and its terminal voltage is outputted to the output terminal P2 through a buffer B. Thus, a peak-holding operation is achieved.

A reset signal, which is externally inputted to the terminal P3 in response to channel switching, is inputted to the reset section 22, and supplied to the inversion input terminal of comparator CMP2. Further, a reference voltage VREF1 is inputted to the non-inversion input terminal of comparator CMP2. A series circuit of switch S1 and constant current source F03 is parallel-connected to the above-mentioned hold capacitor C, and a series circuit of switch S2 and constant current source F04 is connected to the driving-circuit portion of comparator COMP1 as well. Switches S1 and S2 are allowed to conduct when comparator CMP2 outputs "high level".

Therefore, when the reset signal becomes lower than the reference voltage VREF1, that is, an active state, comparator CMP2 allows switches S1 and S2 to conduct. Thus, the charging current I1 from comparator CMP1 is added by the electric current I4 from constant current source F04, and the discharging current I2 is added by the current I3 from constant current source F03. Consequently, upon inputting the reset signal, the charging and discharging currents of the hold capacitor C increase. This makes it possible to improve the response speed of the peak-hold circuit PH.

Figure 2:
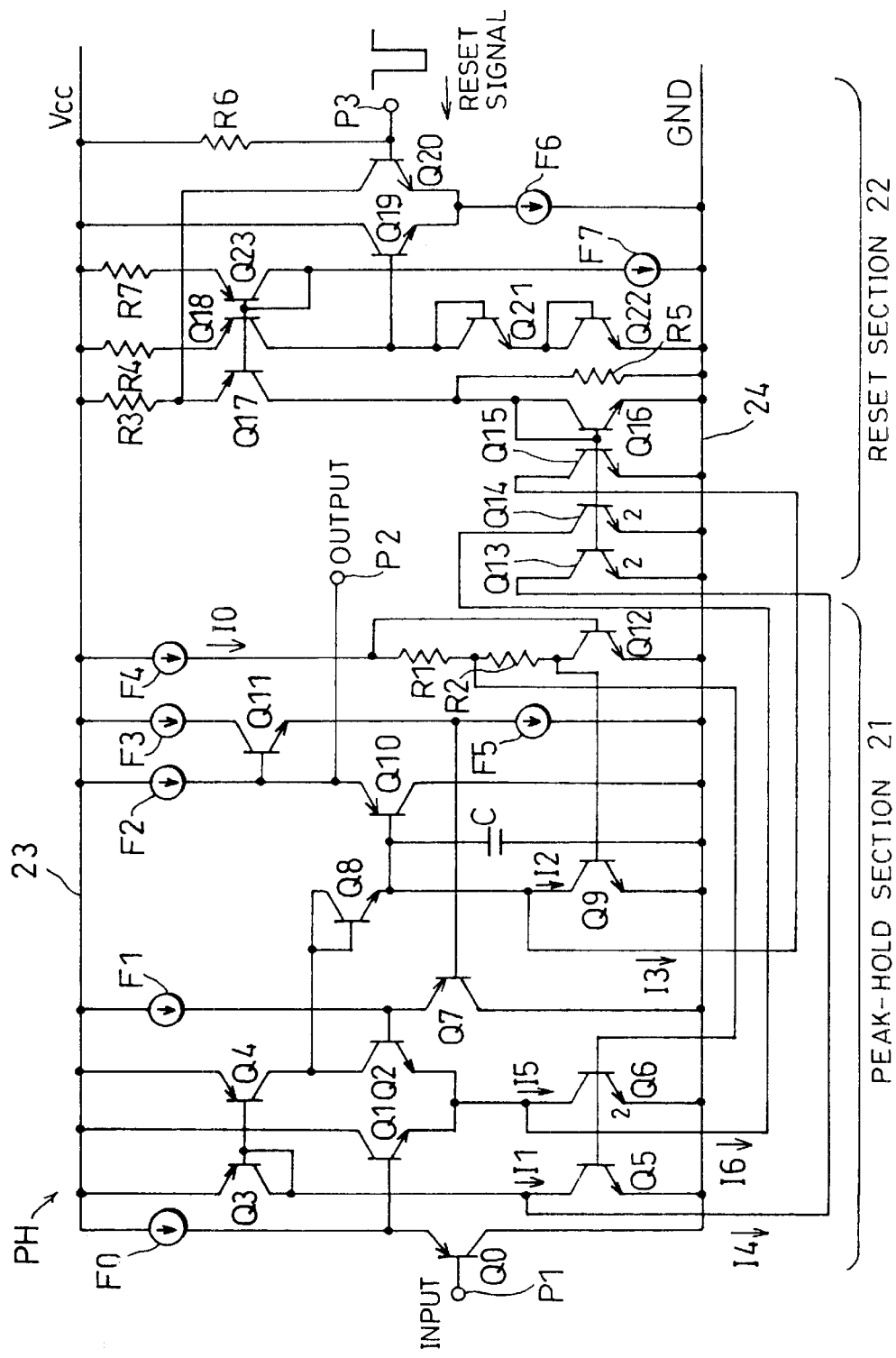
FIG. 2 is an electric-circuit diagram showing a specific construction of the peak-hold circuit shown in FIG. 1.

FIG. 2 is an electric circuit diagram showing a specific construction of the peak-hold circuit PH having the above-mentioned construction. An input signal, inputted to the input terminal P1, is supplied to the base of transistor Q1 that constitutes one of a differential pair through transistor Q0 serving as a buffer. The collector of this transistor Q1 is connected to a power-source line 23 of "high level" Vcc, and the emitter thereof is grounded through transistor Q6, together with the emitter of transistor Q2 that is the other of the pair. Further, the emitter of transistor Q0 is connected to the base of transistor Q1, and also connected to the power-source line 23 through constant current source F0, and the collector thereof is grounded.

The electric potential of the hold capacitor C is outputted to the output terminal P2 through transistor Q10 serving as a buffer. The base of transistor Q10 is connected to one of the terminals of the hold capacitor C, the emitter is connected to the power-source line 23 through constant current source F2, and also connected to the output terminal P2, and the collector is grounded. Moreover, the emitter of this transistor Q10 is connected to the base of transistor Q11 serving as a buffer, the collector of transistor Q11 is connected to the power-source line 23 through constant current source F3, and the emitter is grounded through constant current source F5. The emitter of transistor Q11 is also connected to the base of transistor Q7 serving as a buffer, and the emitter of transistor Q7 is connected to the power-source line 23 through constant current source F1, and also connected to the base of transistor Q2, and the collector thereof is grounded.

Therefore, assuming that the terminal voltage of the hold capacitor C is VC, the base-emitter voltages of transistors Q0, Q7, Q10 and Q11 are respectively $V_{BE}0$, $V_{BE}7$, $V_{BE}10$ and $V_{BE}11$, and the terminal voltage of the input terminal P1 is VP, the base electric potentials VB1 and VB2 of transistors Q1 and Q2 are represented by:

$$VB1=VP+V_{BE}0=VP+V_{BE} \quad (2)$$

$$VB2=VC+V_{BE}10-V_{BE}11+V_{BE}7=VC+V_{BE} \quad (3)$$

Constant electric currents are supplied to transistors Q0, Q7, Q10 and Q11 by constant current sources F0, F1, F2, F3 and F5; thus, in the above equations, it is assumed that $V_{BE}0 \approx V_{BE}7 \approx V_{BE}10 \approx V_{BE}11 = V_{BE}$.

Therefore, the hold capacitor C is charged and discharged in response to the voltage variation of the above-mentioned input signal so that the terminal voltage of the hold capacitor C balances the input signal.

The collector of transistor Q2 is connected to the power-source line 23 through transistor Q4. Transistor Q4 constitutes a current mirror circuit together with transistor Q3, and the emitter of transistor Q3 is connected to the power-source line 23, while the base and collector thereof are grounded through transistor Q5. To the bases of transistor Q5 and transistor Q6 is applied the electric potential of the junction between resistors R1 and R2 in the series circuit of constant current source F4, resistors R1 and R2 and transistor Q12 that is interpolated between the power-source line 23 and a ground line 24. Further, in the series circuit, the electric potential of the junction between resistor R2 and transistor Q12 is supplied to the base of transistor Q9 used for discharge that is parallel-connected with the hold capacitor C. To the hold capacitor C is also applied the collector current of transistor Q4 through transistor Q8 that is diode-connected as the rectifying element D.

Therefore, in the peak-hold section 21 constructed as described above, currents I1, I5 and I2, which are determined by the current I0 regulated by constant current source F4 and resistors R1 and R2, flow through transistors Q5, Q6 and Q9 respectively. The ratio of areas between transistor Q5 and transistor Q6 is set at 1:2. Therefore, when the input signal level is higher than the holding value of hold capacitor C, the charging is carried out based upon the difference I1–I2 between the charging current I1 flowing from transistor Q4 through transistor Q8 and the discharging current I2 flowing therefrom through transistor Q9. Further, when the input signal level is lower than the holding value, the discharging is carried out with I2.

In the reset section 22, the reset signal to the terminal P3 is supplied to the base of transistor Q20 that is one of the differential pair. The base of transistor Q20 is also connected to the power-source line 23 of "high level" Vcc through pull-up resistor R6, the collector is connected to the power-source line 23 through resistor R3, and the emitter is grounded through constant current source F6, together with the emitter of the other transistor Q19 of the differential pair. The collector of transistor Q19 is connected to the power-source line 23, and to the base is applied the electric potential of the junction between transistors Q18 and Q21 in the series circuit of resistor R4 and transistors Q18, Q21 and Q22 that is interpolated between the power-source line 23 and the ground line 24. Transistor Q18 constitutes a current mirror circuit together with transistor Q23, and the emitter of transistor Q23 is connected to the power-source line 23 through resistor R7, and the base and collector thereof are grounded through constant current source F7. Transistors Q21 and Q22 are respectively diode-connected; therefore, 2 $V_{BE}$ (in which $V_{BE}$, approximately 0.7 V, is the base-emitter voltage of transistors Q21 and Q22) is applied to the base of transistor Q19.

Moreover, transistor Q17 constituting a current mirror circuit together with transistor Q23 is installed, and the emitter of transistor Q17 is connected to the power-source line 23 through resistor R3, and the collector is grounded through a parallel circuit of resistor R5 and transistor Q16. Transistor Q16 constitutes a current mirror circuit together with transistors Q13, Q14 and Q15, and these transistors Q13, Q14 and Q15 are respectively placed in parallel with transistors Q5, Q6 and Q9. The ratio of areas of transistor Q13 or Q14 and transistor Q15 is set, for example, at 2:1.

Therefore, when a low-active reset signal is applied to the terminal P3 making the terminal P3 not more than 2 $V_{BE}$, transistor Q20 is cut off, transistor Q19 is allowed to conduct, and the current, bypassed by transistor Q20, is allowed to flow through resistor R5 via transistor Q17, with the result that the base voltage of transistor Q16 rises so that transistor Q16 is allowed to conduct. Consequently, transistors Q13, Q14 and Q15 are allowed to conduct so that the electric currents I1, I5 and I2, which flow through transistors Q5, Q6 and Q9 respectively, are added by electric currents I4, I6 and I3 derived from transistors Q13, Q14 and Q15.

In this case, the response time τ of the peak-hold section 21 is represented as follows using the capacity of the hold capacitor C, the change in voltage ΔV and the current I:

$$\tau = C \times \Delta V/I \quad (4).$$

Thus, by increasing the current I as described above, the response speed of the peak-hold section 21 can be increased as described in FIG. 1. Based upon equation (4), for example, the response speed τ becomes 1/10 by increasing the current I by 10 times so that the currents I4, I6 and I3, applied at the reset section 22, are set at sufficiently great values as compared with the currents I1, I5 and I2 that normally flow.

Figure 3A:
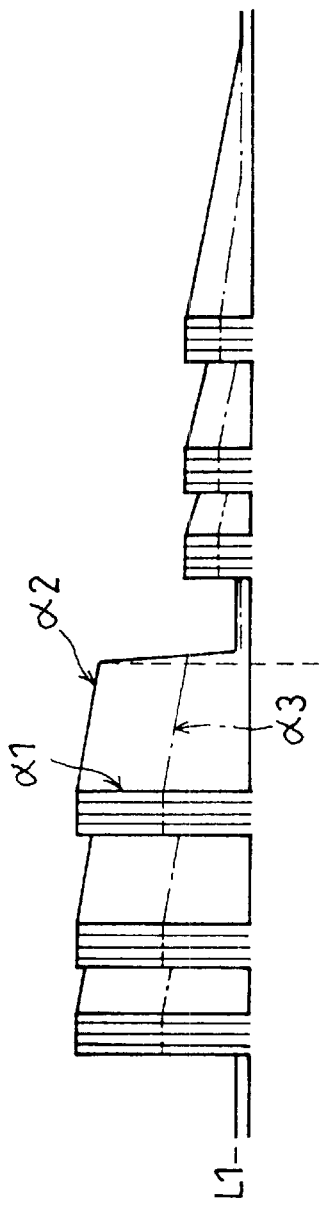
FIGS. 3(a), 3(b) and 3(c) are waveform diagrams that explain operations of the peak-hold circuit shown in FIG. 1 and FIG. 2.
Figure 3B:
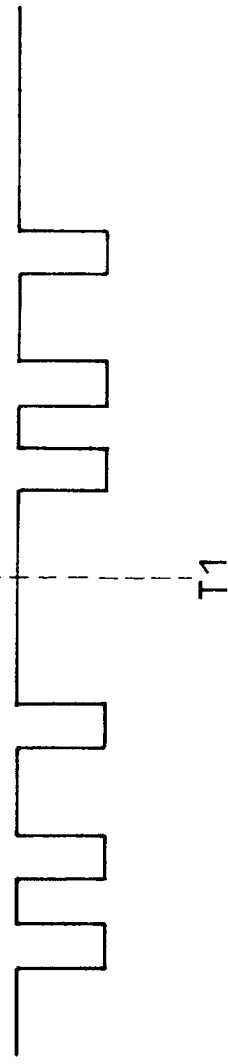

In this manner, both the charging current and discharging current are increased. Therefore, as shown in FIG. 3(a), in response to a great switchover in the level of the input signal waveform indicated by reference symbol α1, by carrying out the resetting operation indicated by time T1, it is possible to prevent the holding value, indicated by reference symbol α2, from dropping below the initial level L1. With this arrangement, even in the case when the peak-hold circuit PH is used in the aforementioned infrared communication device, the detection level does not show a drop, as indicated by reference symbol α3. This thereby makes it possible to obtain an output waveform without error pulses as shown in FIG. 3(b) in response to the input signal waveform indicated by reference symbol α1.

Figure 3C:
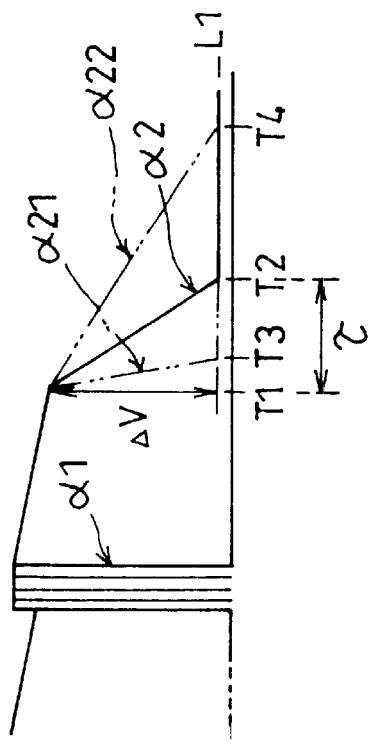

At this time, as indicated in an enlarged manner in FIG. 3(c), it is possible to change the variation in the holding value of the hold capacitor C from the state, as indicated by reference symbol α2, to states as indicated by reference symbols α21 and α22 by changing the current I as described in association with the aforementioned equation (4). Thus, the response time τ, that is, the reset completion time, can be altered from time T2 to desired predetermined times T3 or T4.

As described above, in the peak-hold circuit PH, comparator CMP1 in the peak-hold section 21 compares the input signal and the output signal. When the input signal is higher, the charging current I1 is supplied to the capacitor C. Here, the capacitor C is discharged with the discharging current I2. When a resetting operation is carried out upon input switching, etc., comparator CMP2 in the reset section 22 increases the amount of driving current of comparator CMP1, that is, increases the charging current by I4 and also the discharging current by I3. Since I4>I1 and also I3>I2 hold true, the peak-hold section 21 is allowed to have a fast response speed upon resetting, that is, a small time constant. Thus, it becomes possible to prevent a drop in the holding value, such as occurred in the case of an instantaneous discharge, and also to restore the holding value of the capacitor C readily to the initial level. Therefore, in the peak-hold circuit PH used for creating the detection level of an infrared receiving device, it is possible to prevent malfunction due to resetting of the hold capacitor C.

Figure 4:
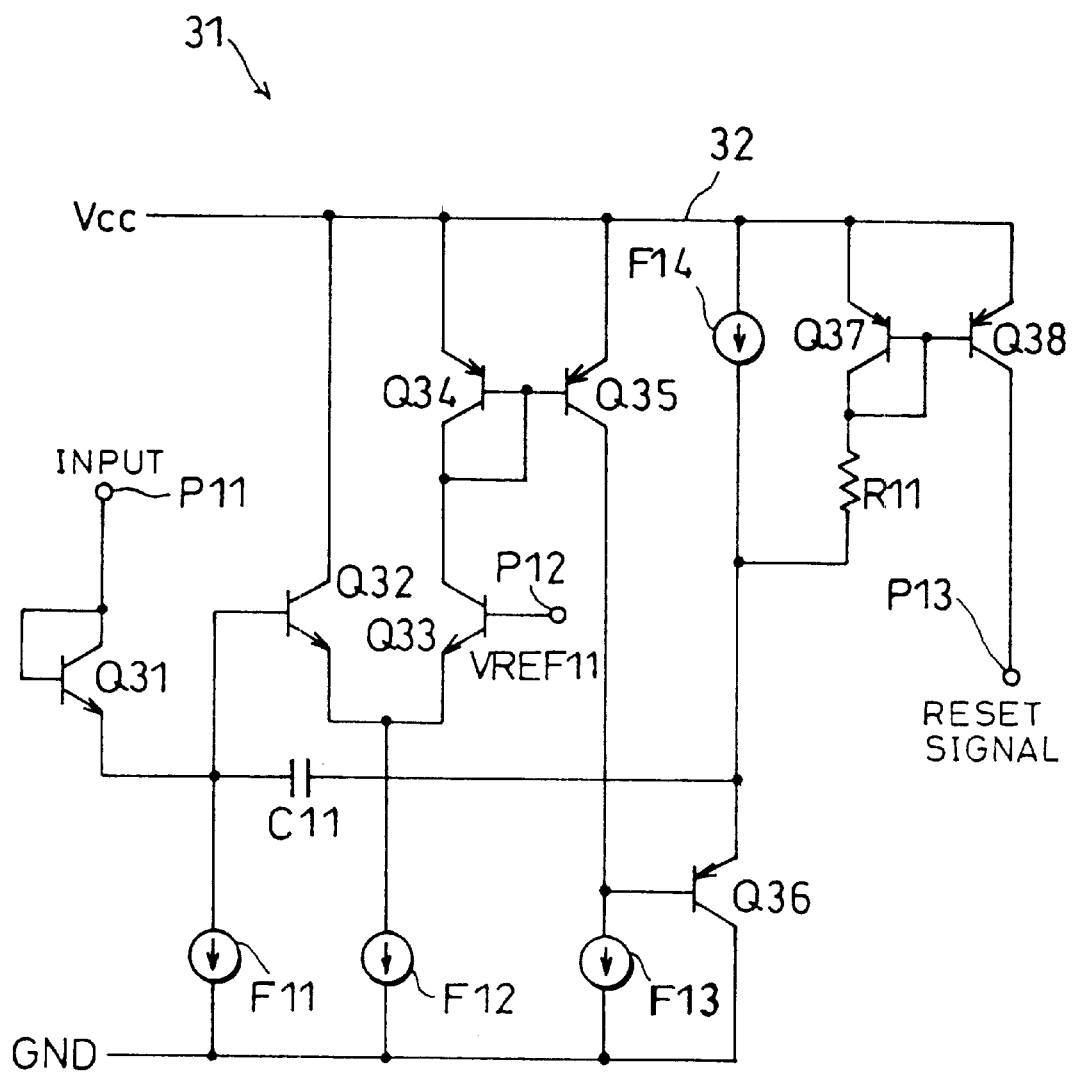
FIG. 4 is an electric-circuit diagram showing a specific construction of a reset circuit that is preferably used in the peak-hold circuit shown in FIGS. 1 and 2.

Additionally, the above-mentioned reset signal may be formed by detecting the completion of the transmitting signal by counting the number of pulses that have been waveform-shaped, or may be outputted by a delay timer after a predetermined time period has been counted from completion of the pulses that have been waveform-shaped, for example, as indicated by the reset circuit 31 of FIG. 4. The reset circuit 31 carries out the operation when each of the inverted pulses that have been waveform-shaped as shown in FIG. 3(b) has been inputted to the input terminal P11.

The inputted signal is supplied to one of the terminals of a delay capacitor C11 through transistor Q31 that is diode-connected. Further, the one of the terminals of the capacitor C11 is connected to the base of transistor Q32 that is one of the differential pair, and is also grounded through constant current source F11. The collector of transistor Q32 is connected to power-source line 32 with "high level" Vcc, and the emitter thereof is grounded through constant current source F12 together with the emitter of paired transistor Q33. To the base of transistor Q33 is supplied a reference voltage VREF11 that is to be inputted to the terminal P12, and the collector is connected to the power-source line 32 through transistor Q34. Transistor Q34 constitutes a current mirror circuit together with transistor Q35, the emitter of transistor Q35 is connected to power-source line 32, and the collector thereof is grounded through constant current source F13, and is also connected to the base of transistor Q36. The emitter of transistor Q36 is connected to the aforementioned power source line 32 through constant current source F14, and is also connected to the other terminal of the delay capacitor C11, and the collector thereof is grounded. The output from the emitter of transistor Q36 is outputted to the output terminal P13 by a current mirror circuit consisting of resistor R11, transistors Q37 and Q38.

Figures 5A, 5B, 5C:
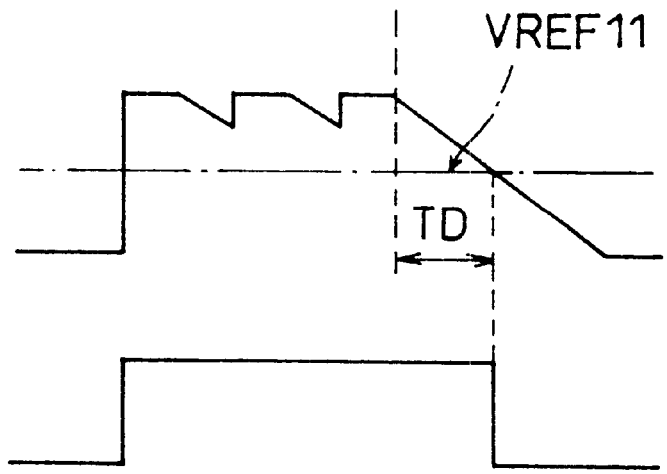
FIGS. 5(a), 5(b) and 5(c) are waveform diagrams that explain operations of the reset circuit shown in FIG. 4.

Therefore, when an input signal, as shown in FIG. 5(a) is supplied to the input terminal P1, a signal as shown in FIG. 5(b) is supplied to the input terminal P11 from the aforementioned comparator CMP1, that is, from the collector of transistor Q4. With respect to the differential pair, when the input signal from the terminal P11 is higher than the reference voltage VREF11 from the terminal P12, transistor Q32 is allowed to conduct and transistor Q33 is cut off; therefore, transistors Q34 and Q35 are cut off, transistor Q36 is allowed to conduct, and one of the terminals of the delay capacitor C11 has an input signal with "high level" with the other terminal at "ground level" so that the delay capacitor C11 is charged while transistors Q37 and Q38 are allowed to conduct making the output terminal P13 "high level".

In contrast, when the base of transistor Q32 becomes not more than the reference voltage VREF11, transistor Q32 is cut off and transistor Q33 is allowed to conduct. Therefore, transistors Q34 and Q35 are allowed to conduct and transistor Q36 is cut off so that the delay capacitor C11 is discharged while transistors Q37 and Q38 are cut off making the output terminal P13 "low level". Even if the input signal to the input terminal P11 becomes lower than the reference voltage VREF11, transistor Q32 is allowed to conduct and transistor Q33 is cut off during the period in which the terminal voltage of the delay capacitor C11 is maintained not less than the reference voltage VREF11.

Figure 12:
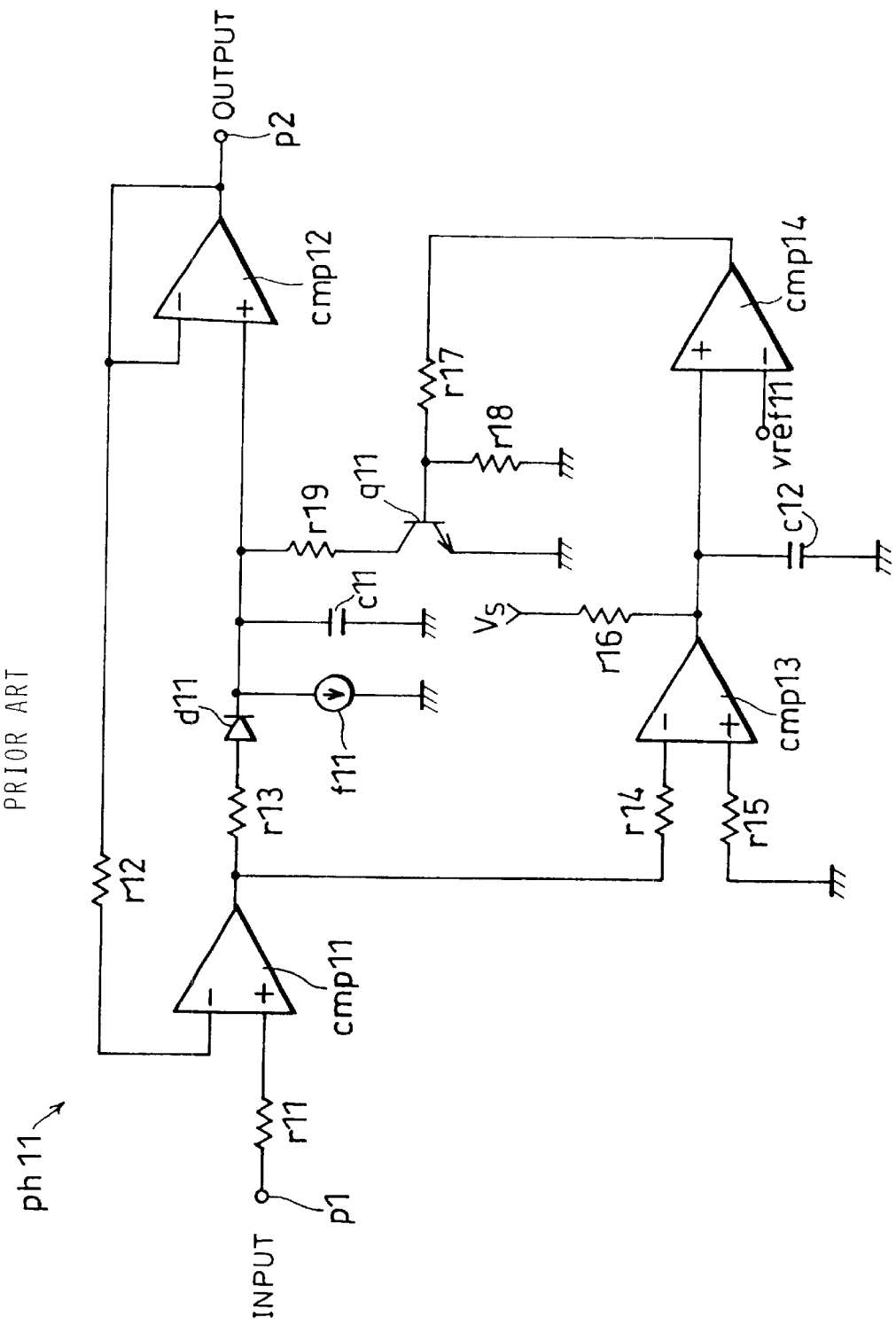
FIG. 12 is a block diagram showing an electrical construction of a typical prior-art peak-hold circuit that can solve the problem as shown in FIG. 11.
Figure 13A:
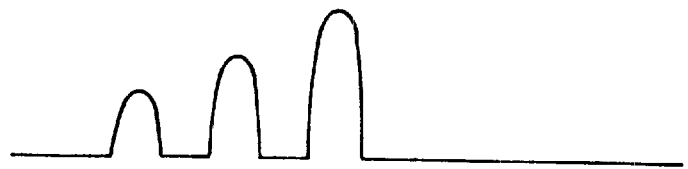
Figure 13B:
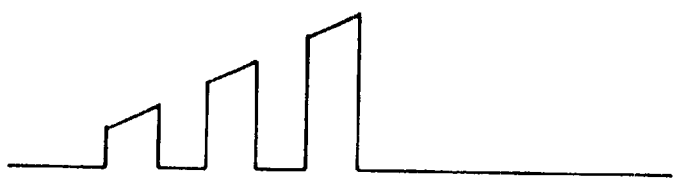
Figure 13C:
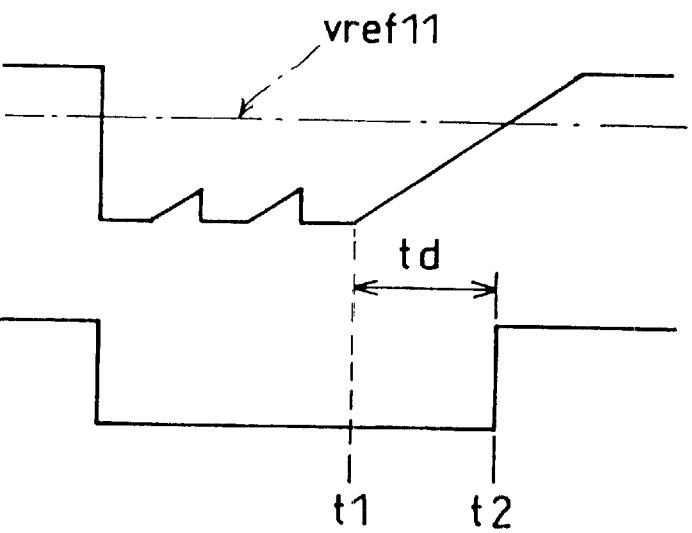
Figure 13D:
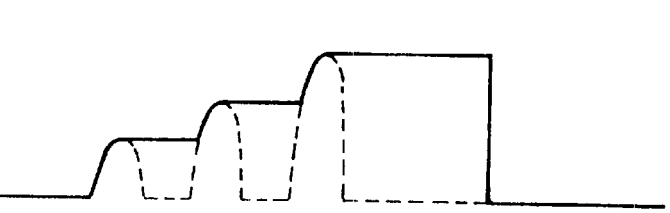

With such a reset circuit 31, through the input terminal P11, the input signal is inputted to the delay capacitor C11 for determining the delay time via transistor Q31 functioning as a rectifying element. Therefore, it becomes possible to simplify the construction by omitting comparator cmp 13, etc. as compared with a delay timer in the peak-hold circuit ph11 as shown in the aforementioned FIG. 12.

Figure 6:
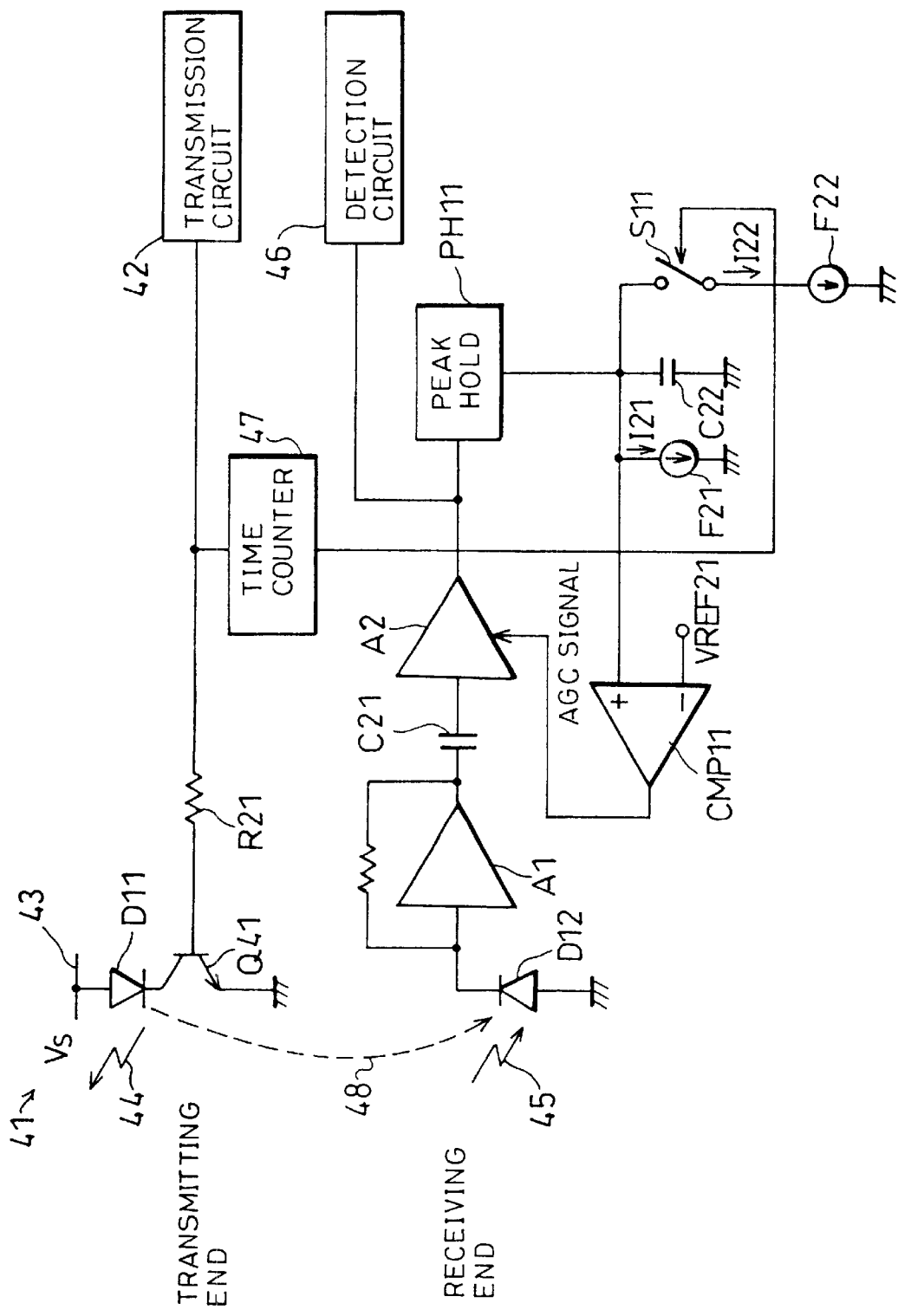
FIG. 6 is a block diagram showing an electrical construction of an infrared communication device of another embodiment of the present invention.
Figure 7:
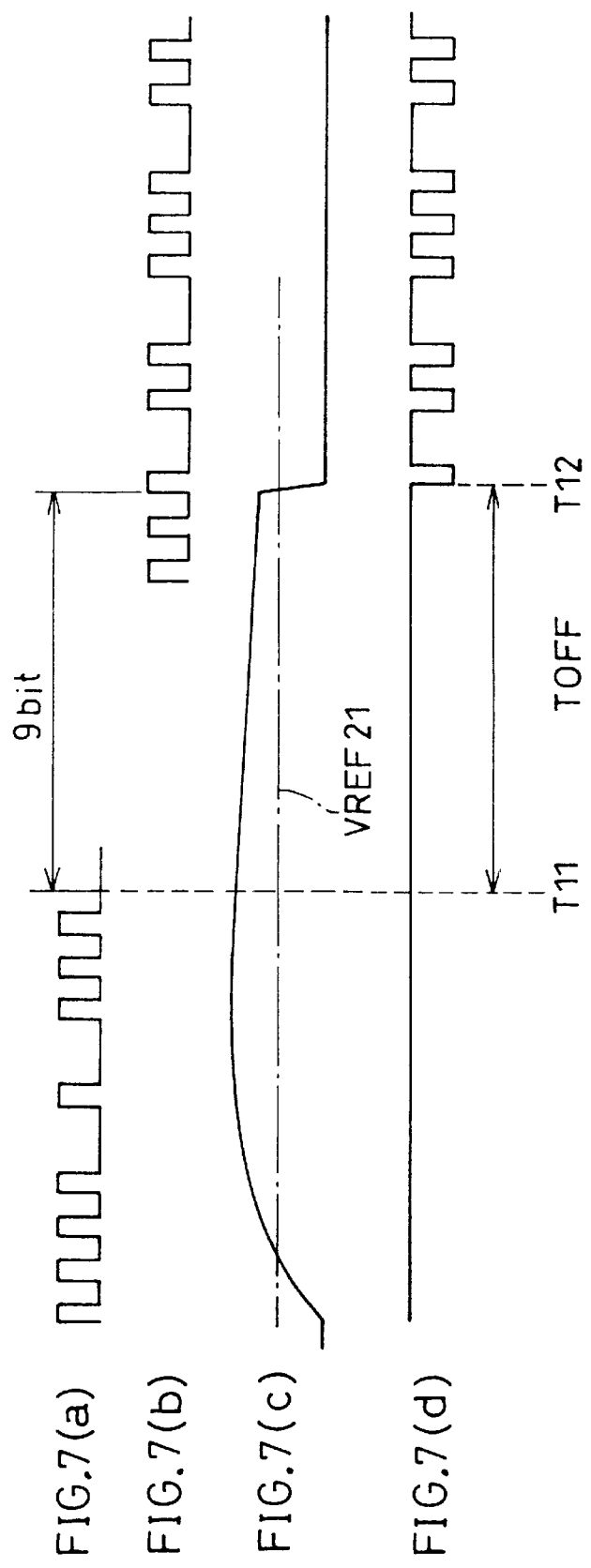
FIGS. 7(a), 7(b), 7(c) and 7(d) are waveform diagrams that explain operations of the infrared communication device shown in FIG. 6.
Figure 8:
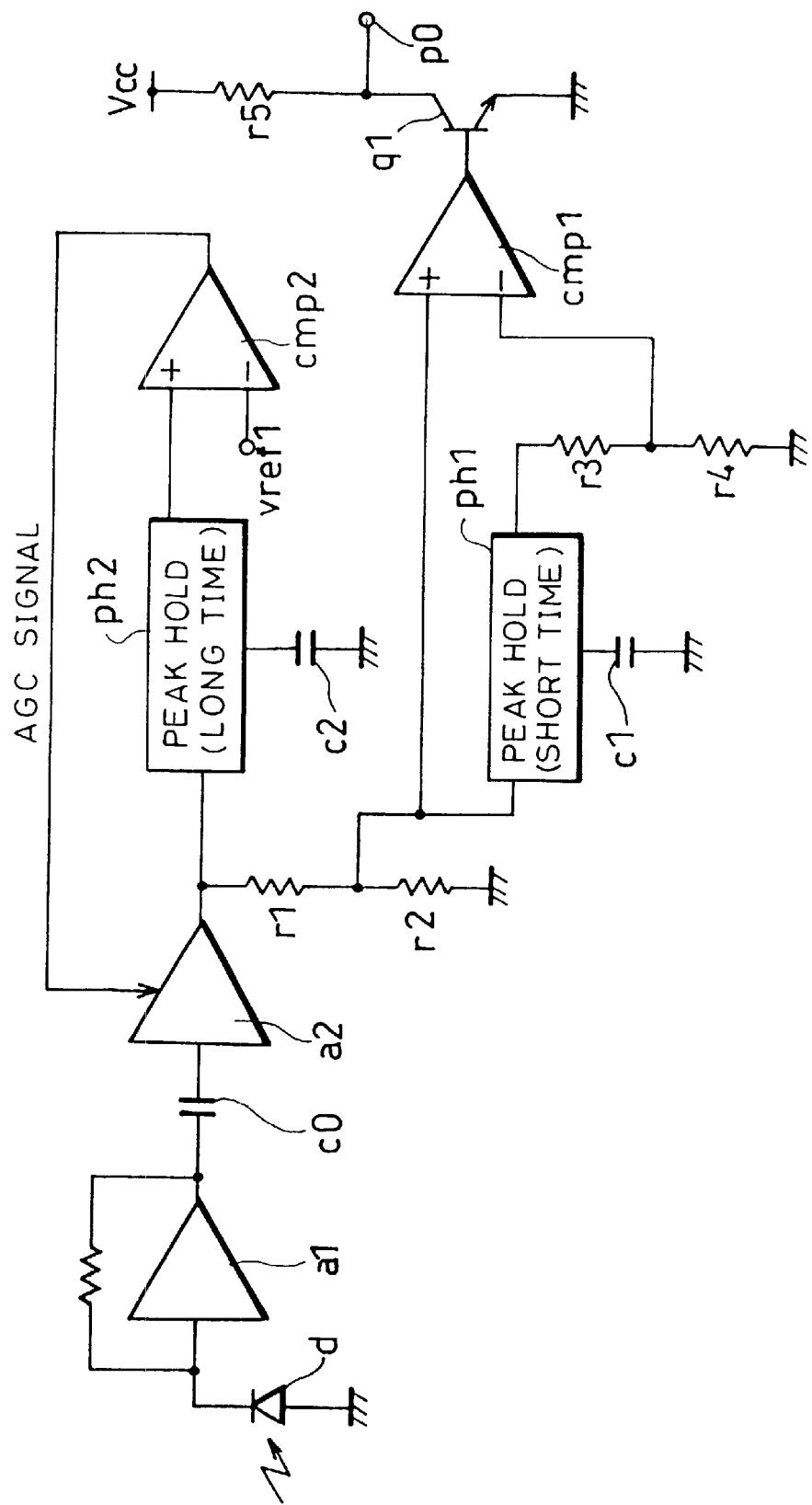
FIG. 8 is a block diagram showing an electrical construction of a commonly-used infrared receiving device.
Figure 9A:
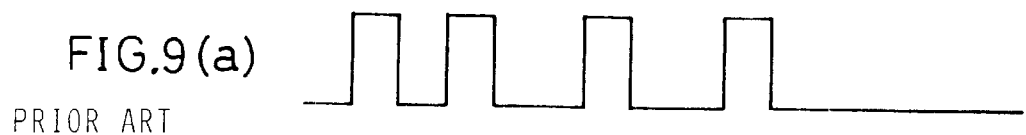
FIGS. 9(a), 9(b) and 9(c) are waveform diagrams that explain operations of the infrared receiving device shown in FIG. 8.
Figure 9B:
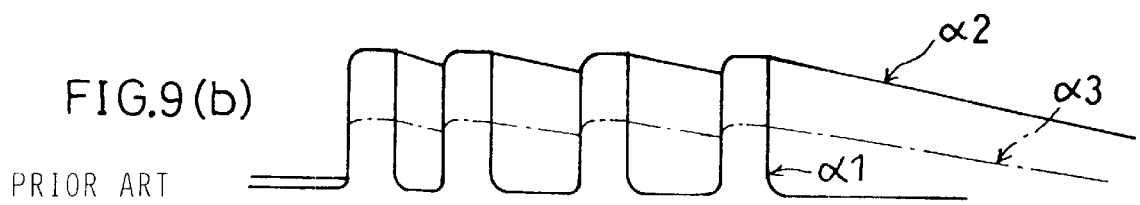
Figure 9C:
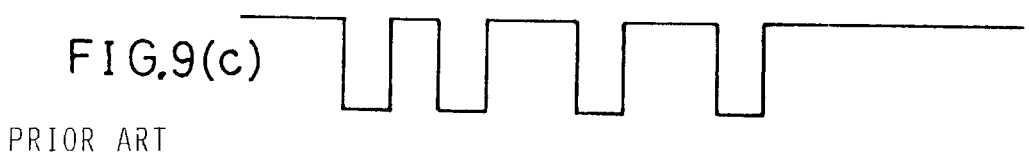
Figure 10:
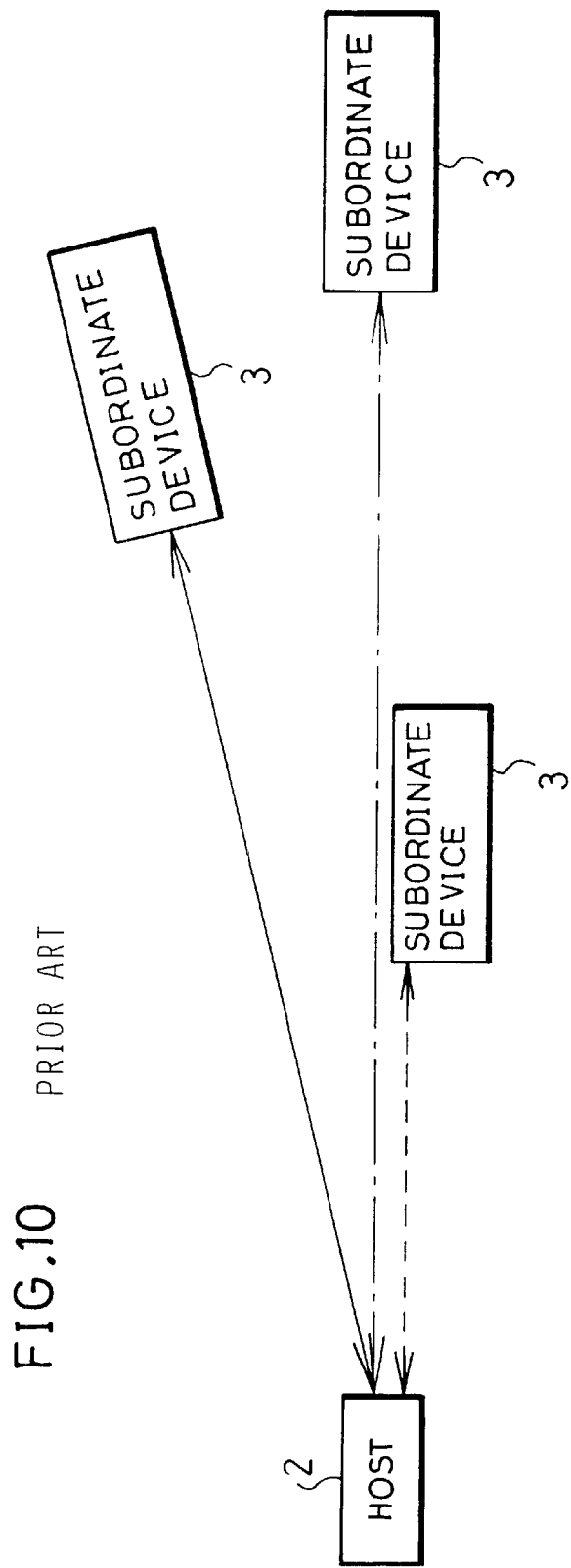
FIG. 10 is a drawing that explains time-sharing multi-channel communication carried out by a plurality of infrared communication devices.
Figure 11:
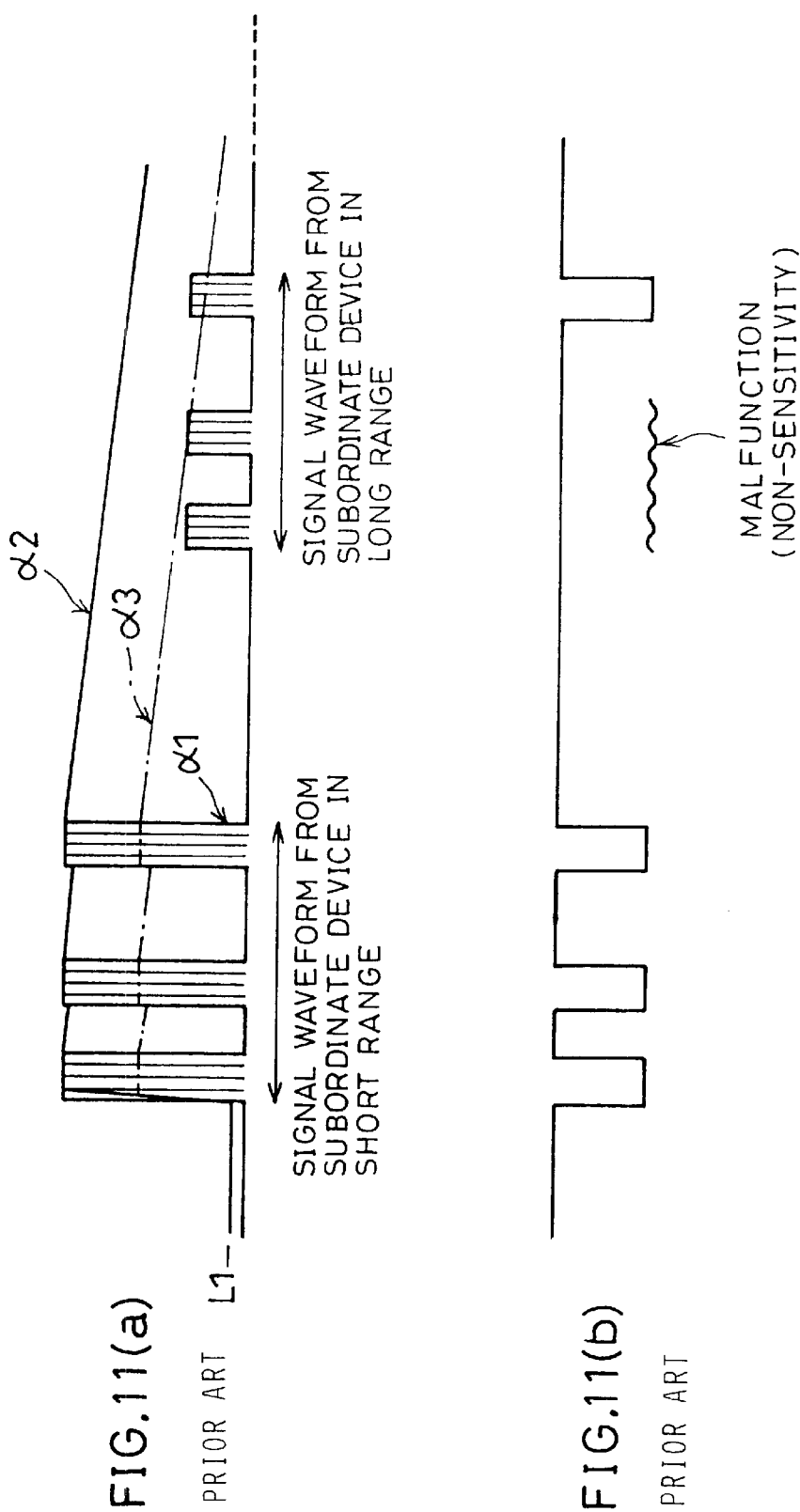
FIGS. 11(a) and 11(b) are waveform diagrams that explain problems with the multi-channel communication shown in FIG. 10.

Referring to FIGS. 6 and 7, the following description will discuss another embodiment of the present invention.

FIG. 6 is a block diagram showing the electrical construction of an infrared communication device 41 of another embodiment of the present invention. As shown in the aforementioned FIG. 15, the infrared communication device 41 is a communication device capable of transmitting and receiving, which is provided with a light-emitting diode D11 and a photo-diode D12 that are mutually sealed into an integral part.

A signal, transmitted from a transmission circuit 42, is supplied to the base of driving transistor Q41 through resistor R21. The collector of transistor Q41 is connected to the cathode of the light-emitting diode D11, and the emitter thereof is grounded. The anode of the light-emitting diode D11 is connected to power-source line 43 with "high level" Vs. Therefore, in response to a pulse of "high level" of the transmitted signal, the light-emitting diode D11 lights up, thereby transmitting a light signal as indicated by reference symbol 44.

At the receiving end, the light signal indicated by reference symbol 45 is received by the photodiode D12, and photoelectrically transferred and inputted to the preamplifier A1. The output of the preamplifier A1 is inputted to the gain-variable amplifier A2 through a coupling capacitor C21. The output of the preamplifier A2 is inputted to a detection circuit 46 having a peak-hold circuit PH as shown in FIGS. 1 and 2, and also inputted to peak-hold circuit PH11 that has a longer time constant than the above-mentioned peak-hold circuit PH.

When the output voltage of the amplifier A2 is higher than the holding value of the holding capacitor C22, peak-hold circuit PH11 charges the hold capacitor C22. Moreover, constant current source F21, used for discharging, is installed in parallel with the hold capacitor C22. The holding value of the hold capacitor C22 is inputted to the non-inversion input terminal of comparator CMP11, and a reference voltage VREF21 is inputted to the inversion input terminal of comparator CMP11. Comparator CMP11 outputs an AGC signal which, when the holding value is higher than the reference voltage VREF21, reduces the gain of the amplifier A2, and when it is lower than the reference voltage VREF21, increases the gain thereof.

The feature of the infrared communication device having the above-mentioned construction lies in that the above-mentioned transmitted signal is also supplied to a time counter 47, and in accordance with the communication regulation, the time counter 47 outputs a reset signal after a predetermined time has elapsed since the time when the pulse of the transmitted signal was no longer detected. The reset signal is supplied to a switch S11 that is placed in parallel with the hold capacitor C22, and when the switch S11 is allowed to conduct, a charge accumulated in the hold capacitor C22 is discharged by constant current source F22.

For example, in the case when the 1/2 RZ communication format is adopted in the time counter 47, since the transmitted signal never has continuous 0s of 9 bits or more, the above-mentioned predetermined time is set at a period corresponding to 9 bits.

Therefore, even when a turnaround occurs in the light signal as indicated by reference symbol 48 from the light-emitting diode D11 to the photodiode D12 due to the transmitted signal shown in FIG. 7(*a*), causing the holding value of the hold capacitor C22 to rise as shown in FIG. 7(*c*) and the gain of the amplifier A2 to drop, the holding value is reset to the initial value at time T12 when a time period equivalent to dead time TOFF corresponding to 9 bits of the transmitted signal has elapsed from completion of the transmission of the signal as indicated by time T11. Therefore, as shown in FIG. 7(*d*), it becomes possible to readily receive a signal that has been transmitted from the other communication end as shown in FIG. 7(*b*).

As described above, in the infrared communication device 41 which is a communication device having light receiving and emitting elements as an integral part, after the predetermined dead time TOFF has elapsed since the detection of completion of the transmitted signal, the AGC signal is reset so as to readily make a switchover to a receiving operation. Thus, the dead time TOFF is shortened as compared with the conventional dead time toff as shown in FIG. 16 so that the performance is improved.

Additionally, with respect to the resetting operation of peak-hold circuit PH11, increases in the charging and discharging currents may be adopted in the same manner as the aforementioned peak-hold circuit PH. Moreover, the peak-hold circuit PH inside the detection circuit 46 may be reset by the aforementioned reset signal from the time counter 47.

As described above, in the peak-hold circuit of the present invention in which a hold circuit captures the peak value of an input signal and a reset circuit carries out a resetting operation on the holding value of the hold circuit when, upon switching inputs, it receives a reset signal, the charge of the hold capacitor is not discharged instantaneously by using a switching means and a resistor, but discharged with a high response speed by minimizing the time constant of the hold circuit. Thus, an improved resetting operation is carried out.

Therefore, it becomes possible to prevent undershoot in which the holding value drops below a predetermined initial level, and consequently to prevent malfunction.

With respect to a specific construction of the reset section the reset section is preferably designed to have constant current circuits and switching circuit for increasing a charging current and a discharging current of the hold circuit respectively.

As described above, in the infrared communication device of the present invention which is an infrared communication device for waveform-shaping by level-discriminating the output from a photoelectric transfer element based on a predetermined detection level, the peak-hold circuit of the present invention is adopted as the peak-hold circuit for setting the detection level.

Therefore, the resetting operation of the holding value of the peak-hold circuit is carried out without undershoot so that it is possible to prevent error pulses from appearing in the detection output waveform based upon the holding value, and also to preferably receive infrared signals from a plurality of communication devices having different ranges and angles of beam spread in a time-sharing manner, upon carrying out multi-channel communication.

Moreover, as described above, in another infrared communication device of the present invention which is a bidirectional infrared communication device having light receiving and emitting elements that are integral with each other, no level variation takes place in the transmitted signal during a predetermined period such as the maximum dead time determined by the communication regulation. Thus, the completion of the transmitted signal is readily detected, thereby allowing the receiving device to restore its sensitivity.

Therefore, the holding value of the peak-hold circuit and the sensitivity of the receiving device, which have varied from predetermined initial values due to infrared light upon transmission, can be reset properly. Further, the receiving operation can be readily started after the lapse of the predetermined time, thereby making it possible to improve the performance.

The sensitivity restoration of the receiving device is preferably achieved by carrying out a reset of the holding value of the second peak-hold circuit for setting the AGC level.

Thus, the restoration of the sensitivity of the receiving device to the predetermined initial level can be positively achieved. Moreover, in addition to this, a reset of the holding value of the first peak-hold circuit for setting the detection level may be carried out.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A peak-hold circuit, comprising:

hold means for capturing a peak value of an input signal; and reset means for carrying out a resetting operation on a holding value of the hold means when it receives a reset signal, wherein the reset means, upon receipt of the reset signal, improves a response speed of the hold means by a predetermined time period by increasing a charging current and a discharging current of the hold means.

2. The peak-hold circuit as defined in claim 1, wherein the reset means includes constant current circuits and switching means for respectively increasing the charging current and the discharging current of the hold means.

3. An infrared communication device capable of time-sharing multi-channel communication, comprising:

a photoelectric transfer element for photoelectrically transferring a received infrared signal;

a peak-hold circuit for capturing a peak value of an output from the photoelectric transfer element and for setting a detection level based upon the peak value; and an output circuit for waveform-shaping an output from the photoelectric transfer element by level-discriminating the output based on the set detection level, wherein the peak-hold circuit includes hold means which captures a peak value of an input signal and a reset means which carries out a resetting operation on a holding value of the hold means when it receives a reset signal, wherein the reset means, upon receipt of the reset signal, improves a response speed of the hold means by a predetermined time period by increasing a charging current and a discharging current of the hold means.

4. The infrared communication device as defined in claim 3, wherein the reset means includes constant current circuits and switching means for respectively increasing the charging current and the discharging current of the hold means.

5. An infrared communication device, which is a bidirectional infrared communication device having light receiving and emitting elements that are integral with each other, comprising: a time counter which, based on the fact that no level variation takes place in a transmitted signal during a predetermined period, detects completion of the transmitted signal, and allows a receiving device to restore its sensitivity, wherein the receiving device includes:a gain-variable amplifier for amplifying a photoelectrically transferred output from the light-receiving element; a first peak-hold circuit for carrying out a peak detection using comparatively short time constant so as to set the detection level based upon the output of the amplifier; a second peak-hold circuit for carrying out a peak detection using a comparatively long time constant so as to achieve an AGC operation by detecting a noise level of the output of the amplifier and controlling the gain of the amplifier in response to a result of the detection; and an output circuit for waveform-shaping by level-discriminating the output of the amplifier by the detection level that has been set by the first peak-hold circuit, wherein the time counter carries out a resetting operation on the gain of the amplifier by resetting at least a holding value of the second peak-hold circuit, thereby allowing the sensitivity restoration.

6. The infrared communication device as defined in claim 5, wherein the time counter also resets a holding value of the first peak-hold circuit.

7. The infrared communication device as defined in claim 5, wherein in the first peak-hold circuit, in which a hold means captures the peak value of an input signal and a reset means carries out a resetting operation on the holding value of the hold means when it receives a reset signal, The reset means, upon receipt of the reset signal, improves the response speed of the hold means by a predetermined time period.

8. The infrared communication device as defined in claim 7, wherein the reset means includes constant current circuits and switching means for respectively increasing a charging current and a discharging current of the hold means.

9. A peak hold circuit, comprising:

hold means for capturing a peak value of an input signal; and reset means for, upon receipt of a reset signal, carrying out a resetting operation on a holding value of the hold means, wherein:

the reset means includes:

a first constant current circuit for increasing a charging current to a hold capacitor of the hold means;

a second constant current circuit for increasing a discharging current from the hold capacitor of the hold means; and first and second switches for, upon receipt of the reset signal, coupling the hold means to the first and second constant current circuits respectively, the reset means, upon receipt of the reset signal, resetting the holding value of the hold means without undershoot.

10. The peak hold circuit as defined in claim 9, wherein:

a time from receipt of the reset signal to completion of a resetting operation is shortened by a predetermined time period by adjusting at least one of a capacitance of the hold capacitor, a current value of the first constant current circuit, and a current value of the second constant current circuit.

* * * * *